United States Patent [19]
Chang

[11] Patent Number: 5,814,547
[45] Date of Patent: Sep. 29, 1998

[54] FORMING DIFFERENT DEPTH TRENCHES SIMULTANEOUSLY BY MICROLOADING EFFECT

[75] Inventor: Kuan-Lun Chang, Hsinchu, Taiwan

[73] Assignee: Industrial Technology Research Institute, Hsin-Chu, Taiwan

[21] Appl. No.: 944,573

[22] Filed: Oct. 6, 1997

[51] Int. Cl.⁶ ............................................. H01L 21/8222
[52] U.S. Cl. ...................... 438/329; 438/318; 438/329; 438/359; 438/361; 438/362
[58] Field of Search ................... 438/309, 318, 438/324, 337, 359, 361, 362, 329

[56] References Cited

U.S. PATENT DOCUMENTS

| | | | |
|---|---|---|---|
| 3,579,058 | 5/1971 | Armgarth | 29/576 |
| 4,256,514 | 3/1981 | Pogge | 148/1.5 |
| 4,318,751 | 3/1982 | Horng | 29/580 |
| 4,333,227 | 6/1982 | Horng et al. | 29/580 |
| 4,338,138 | 7/1982 | Cavaliere et al. | 148/1.5 |
| 4,378,630 | 4/1983 | Horng et al. | 29/580 |
| 4,466,178 | 8/1984 | Soclof | 29/576 |
| 4,690,729 | 9/1987 | Douglas | 156/643 |
| 4,829,015 | 5/1989 | Schaber et al. | 437/31 |
| 4,965,217 | 10/1990 | Desilets et al. | 437/32 |
| 5,011,788 | 4/1991 | Kawaji et al. | 437/228 |
| 5,141,888 | 8/1992 | Kawa et al. | 437/33 |
| 5,192,708 | 3/1993 | Beyer et al. | 437/90 |
| 5,200,348 | 4/1993 | Uchida et al. | 437/33 |
| 5,298,450 | 3/1994 | Verret | 437/67 |
| 5,316,978 | 5/1994 | Boyd et al. | 437/203 |
| 5,352,923 | 10/1994 | Boyd et al. | 257/536 |
| 5,362,669 | 11/1994 | Boyd et al. | 437/228 |
| 5,397,731 | 3/1995 | Takemura | 437/67 |
| 5,411,913 | 5/1995 | Bashir et al. | 437/67 |
| 5,413,966 | 5/1995 | Schoenborn | 437/225 |
| 5,492,858 | 2/1996 | Bose et al. | 437/67 |

*Primary Examiner*—Jey Tsai
*Assistant Examiner*—Long Pham
*Attorney, Agent, or Firm*—George O. Saile; Stephen B. Ackerman; Rosemary L. S. Pike

[57] ABSTRACT

A new method of forming simultaneously both shallow and deep trenches is described. A pad oxide layer is provided over a semiconductor substrate. A silicon nitride layer is deposited overlying the pad oxide layer. A silicon dioxide layer is deposited overlying the silicon nitride layer. A photoresist mask is formed over the silicon dioxide layer wherein the photoresist mask has a first opening having a first width and a second opening having a second width and wherein the second width is larger than the first width. Trench openings are etched through the silicon dioxide, silicon nitride, and pad oxide layers to the underlying semiconductor substrate within the first and second openings. The photoresist mask is removed. The substrate is etched into through the trench openings to form first and second trenches wherein the first trench within the first opening having the first width is a shallow trench having a first depth and wherein the second trench within the second opening having the second width is a deep trench having a second depth greater than the first depth completing the formation of shallow and deep trenches simultaneously in the fabrication of an integrated circuit.

20 Claims, 5 Drawing Sheets

5,814,547

FORMING DIFFERENT DEPTH TRENCHES SIMULTANEOUSLY BY MICROLOADING EFFECT

BACKGROUND OF THE INVENTION (1) Field of the Invention

The invention relates to the formation of deep and shallow trenches and more particularly, to a method of forming deep and shallow trenches simultaneously in the fabrication of integrated circuits.

(2) Description of the Prior Art

Devices such as Bipolar devices require both shallow and deep trenches for isolation of active areas from one another. In the prior art, two masking steps are required to form both the shallow and the deep trenches.

U.S. Pat. No. 5,413,966 to Schoenborn teaches a method of avoiding microloading in trench etching by using a sacrificial layer of polysilicon. U.S. Pat. No. 5,492,858 to Bose et al teaches a method of filling shallow trench isolation trenches. U.S. Pat. No. 4,690,729 to Douglas teaches forming trenches having tapered sidewalls.

SUMMARY OF THE INVENTION

A principal object of the present invention is to provide an effective and very manufacturable method of forming both shallow and deep trenches using only one mask step.

Another object of the present invention is to provide a method of forming deep and shallow trenches simultaneously whereby less surface area is used for isolation than in the prior art.

In accordance with the objects of this invention a new method of forming simultaneously both shallow and deep trenches is achieved. A pad oxide layer is provided over a semiconductor substrate. A silicon nitride layer is deposited overlying the pad oxide layer. A silicon dioxide layer is deposited overlying the silicon nitride layer. A photoresist mask is formed over the silicon dioxide layer wherein the photoresist mask has a first opening having a first width and a second opening having a second width and wherein the second width is larger than the first width. Trench openings are etched through the silicon dioxide, silicon nitride, and pad oxide layers to the underlying semiconductor substrate within the first and second openings. The photoresist mask is removed. The substrate is etched into through the trench openings to form first and second trenches wherein the first trench within the first opening having the first width is a shallow trench having a first depth and wherein the second trench within the second opening having the second width is a deep trench having a second depth greater than the first depth completing the formation of shallow and deep trenches simultaneously in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

It should be understood that this invention is not limited to the embodiment of FIGS. 1 through 10 wherein a Bipolar integrated circuit device is illustrated. The process of the present invention can be used in other applications requiring both shallow and deep trenches, such as dynamic random access memory (DRAM) applications or logic MOSFET or bipolar devices.

Figure 1:
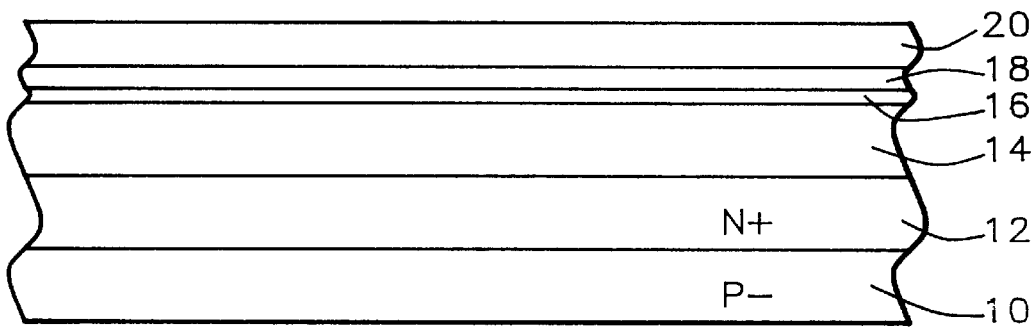
FIGS. 1 through 9 schematically illustrate in cross-sectional representation a preferred embodiment of the present invention.

Referring now more particularly to FIG. 1, there is shown a portion of a partially completed Bipolar integrated circuit device. There is shown a monocrystalline semiconductor substrate 10 which is doped to have a polarity of P−. An N+ barrier layer 12 is formed as is conventional in the art, followed by the growth of epitaxial layer 14. In other applications, a bare semiconductor substrate or a substrate containing semiconductor device structures covered with an insulating layer may be substituted.

A pad oxide layer 16 is grown or deposited over the epitaxial layer to a thickness of between about 200 to 800 Angstroms, but preferably 350 to 550 Angstroms. A silicon nitride ($Si_3N_4$) layer 18 is deposited by low pressure chemical vapor deposition (LPCVD) overlying the pad oxide layer to a thickness of about 1500 Angstroms. A silicon dioxide layer 20 is deposited by LPCVD overlying the silicon nitride layer 18 to a thickness of between about 5000 and 10,000 Angstroms.

Figure 2:
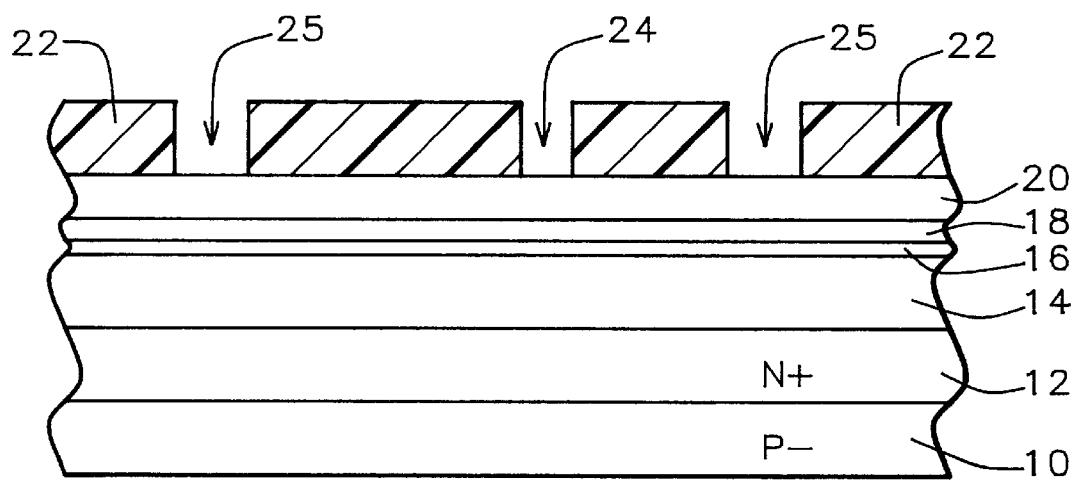

Referring now to FIG. 2, a layer of photoresist 22 is coated over the silicon dioxide layer 20 and patterned to leave openings 24 and 25 where trenches are to be formed. The openings 24 and 25 are of different widths. Small opening 24 can be as small as 0.5 micron or smaller, depending upon the etcher design and etching chemistry. Larger openings 25 could be 1.0 or 0.8 micron in width, for example.

Figure 3:
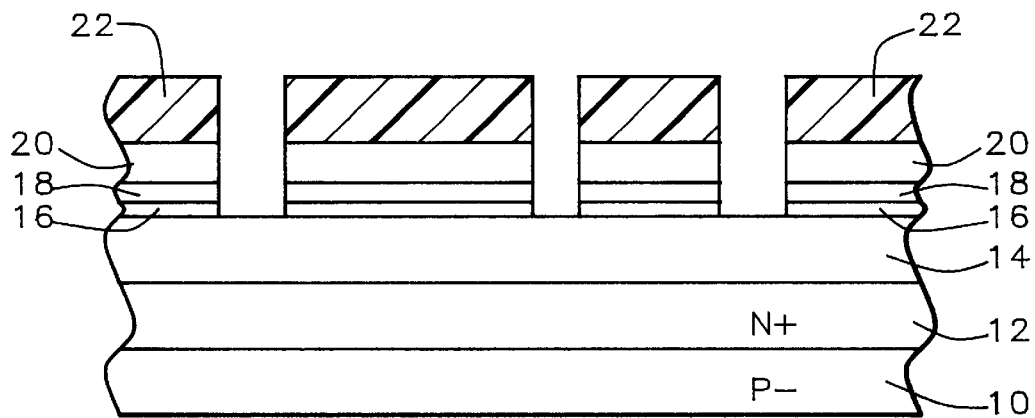

Referring now to FIG. 3, the silicon dioxide, silicon nitride, and pad oxide layers 20, 18, and 16, respectively, are etched through using a dry etching process where they are not covered by photoresist mask 22.

Figure 4:
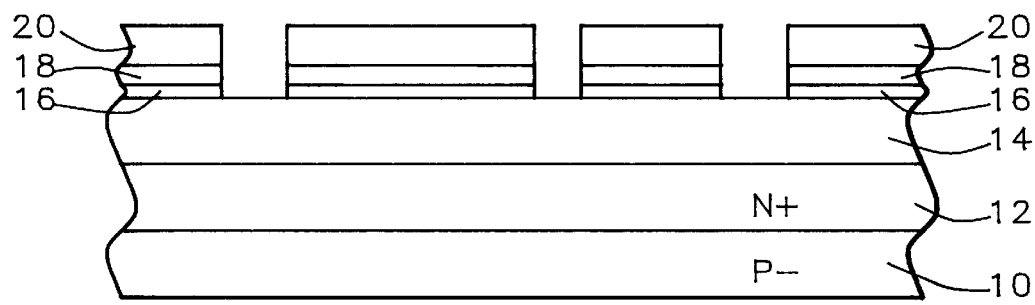

The photoresist mask is removed, such as by oxygen ashing, as shown in FIG. 4.

Figure 5:
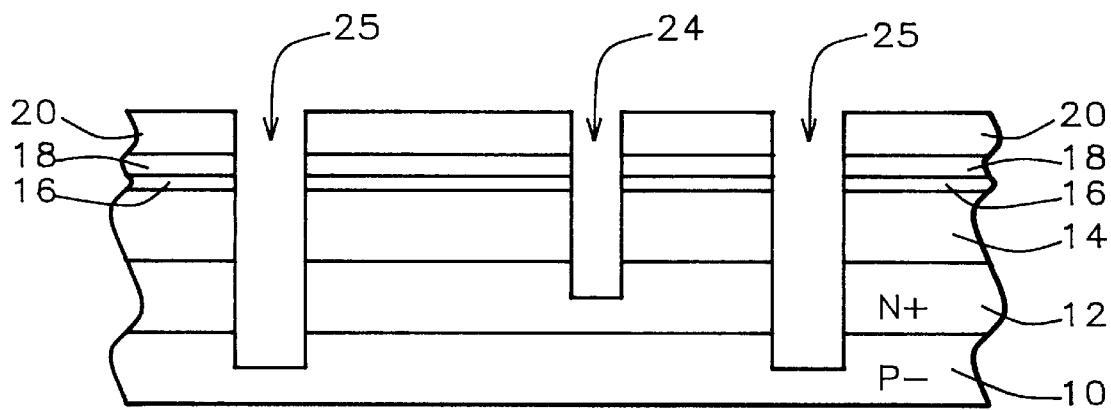

Referring now to FIG. 5, the trenches 24 and 25 are extended down through the silicon layers 14, 12, and 10, using the silicon dioxide, silicon nitride, and pad oxide layers 20, 18, and 16, respectively, as a hard mask. Because of microloading effects, the trench 24 having the smaller opening is etched to a shallower depth than the trenches 25 having wider openings. Thus, shallow trench 24 and deep trenches 25 are formed simultaneously.

The microloading effect is that smaller openings are etched more shallowly than larger openings. Workers in the art have tried to avoid the microloading effect, but the present invention uses the microloading effect to advantage to form simultaneously both deep and shallow trenches.

Shallow trench 24 may have a depth of between about 1 to 3 microns and deep trenches 25 may have a depth of between about 3 to 6 microns.

Figure 6:
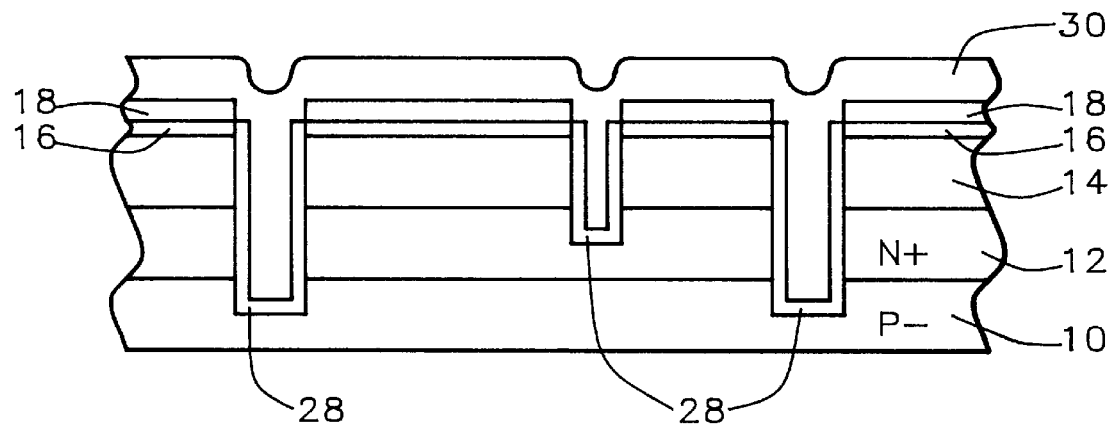
Figure 7:
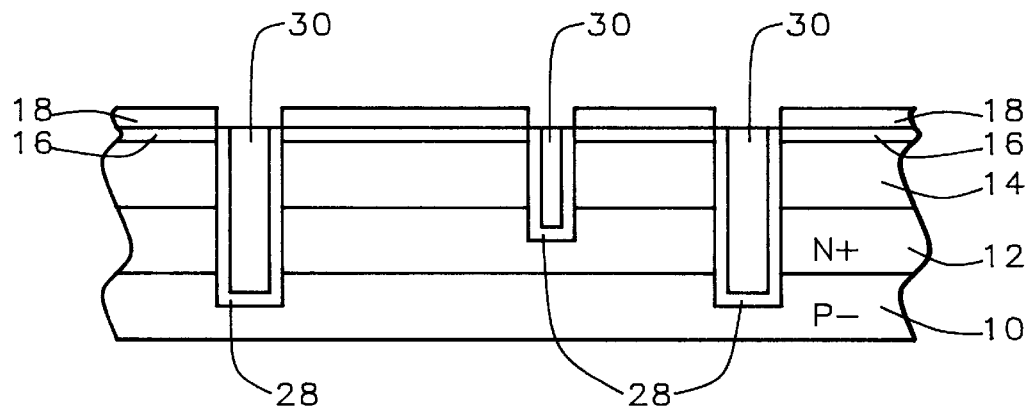

Next, the silicon dioxide layer 20 is removed, such as by wet etching. A thermal oxide 28 is grown within the trenches, as shown in FIG. 6, to a thickness of between about 500 and 5000 Angstroms. This thermal oxidation also removes etching damage. A layer of polysilicon 30 is deposited by LPCVD over the surface of the silicon nitride layer and filling the trenches. The thickness of the polysilicon 30 is between about 5000 and 7000 Angstroms, depending on the size of the trench opening. The polysilicon layer is etched back to leave the polysilicon 30 only within the trenches, as shown in FIG. 7. This completes the simultaneous deep and shallow trench formation.

Figure 8:
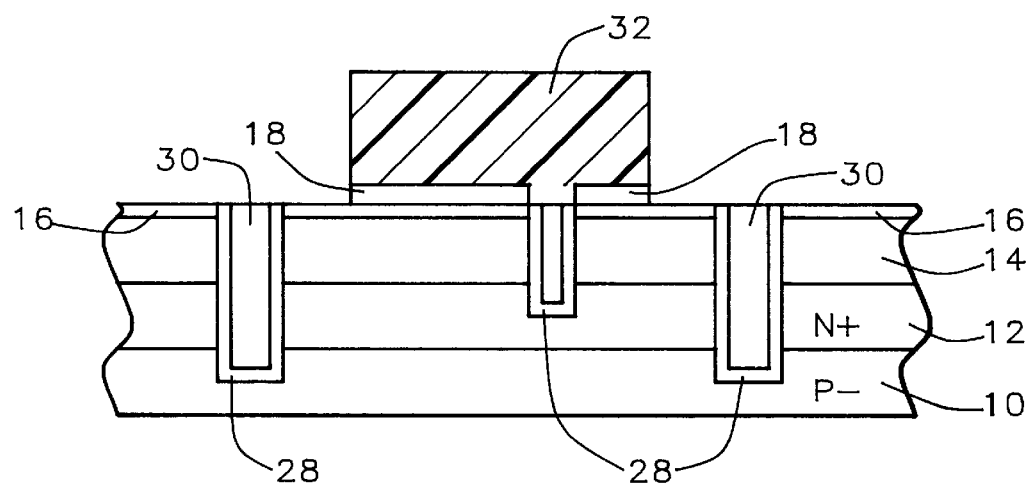
Figure 9:
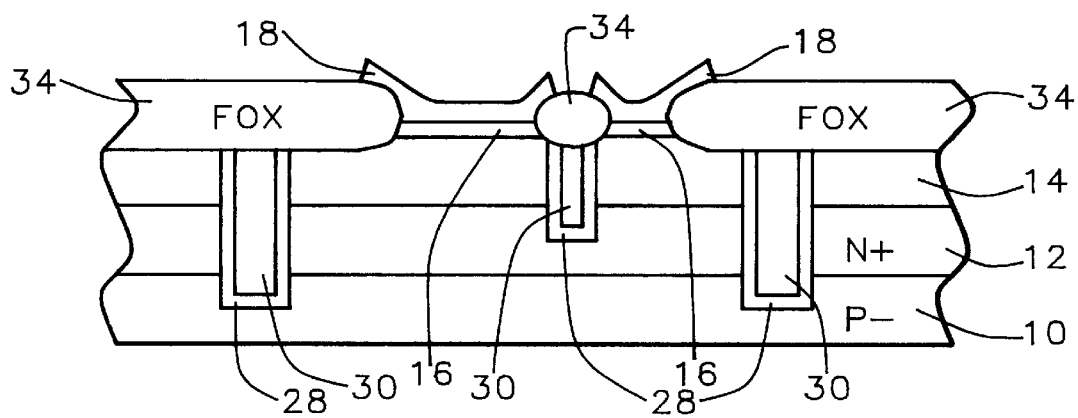

Referring now to FIG. 8, a layer of photoresist 32 is coated over the silicon nitride layer 18 and patterned as shown. The photoresist mask is removed and local oxidation of silicon (LOCOS) is performed, as conventional in the art, to form field oxide regions 34, as illustrated in FIG. 9, over the trenches and elsewhere where the silicon nitride layer has been removed.

Figure 10:
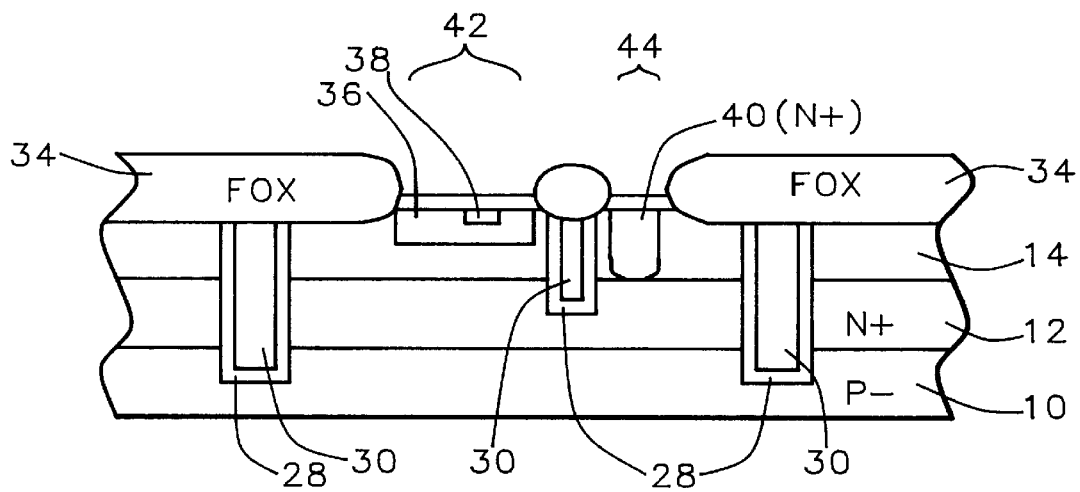
FIG. 10 schematically illustrates in cross-sectional representation a preferred embodiment of this invention for a Bipolar device.

Referring now to FIG. 10, the Bipolar device is completed by forming base region 36 and emitter region 38 in the active region 42 and forming N+ contact region 40 in the collector region 44.

Figure 11:
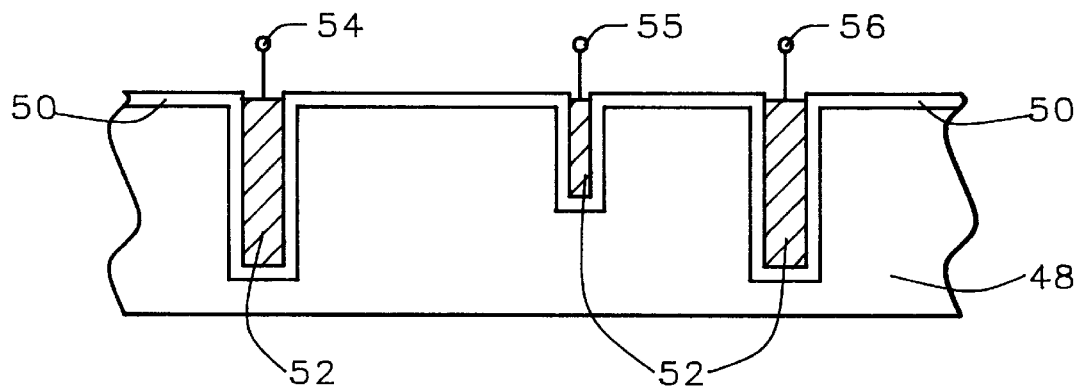
FIG. 11 schematically illustrates in cross-sectional representation a preferred embodiment of this invention for a memory device.

FIG. 11 illustrates another application of the present invention. The process of the invention can be used to form capacitors 54, 55, and 56, each having different capacitances. The trenches are formed by the same microloading effect to have different depths, depending upon the widths of their openings. A silicon dioxide or ONO (silicon oxide, silicon nitride, silicon oxide) layer 50 is deposited over the substrate and within the trenches. The trenches are filled with polysilicon 52 to form the capacitors having different capacitances, depending upon the depths of the trenches within the substrate. These capacitors can be used in applications such as DRAM or MOSFET or Bipolar logic devices.

The process of the present invention provides an effective and very manufacturable method of simultaneously forming both deep and shallow trenches using only one masking step. The present invention uses the microloading effect to advantage to form both deep and shallow trenches by using a mask having wider openings where deeper trenches are to be formed and narrower openings where shallower trenches are to be formed.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow and deep trenches simultaneously in the fabrication of an integrated circuit comprising:
   providing a pad oxide layer over a semiconductor substrate;
   depositing a silicon nitride layer overlying said pad oxide layer;
   depositing a silicon dioxide layer overlying said silicon nitride layer;
   forming a photoresist mask over said silicon dioxide layer wherein said photoresist mask has a first opening having a first width and a second opening having a second width and wherein said second width is larger than said first width;
   etching trench openings through said silicon dioxide, silicon nitride, and pad oxide layers to said underlying semiconductor substrate within said first and second openings;
   removing said photoresist mask; and
   thereafter etching into said substrate through said trench openings to form first and second trenches wherein said first trench within said first opening having said first width is a shallow trench having a first depth and wherein said second trench within said second opening having said second width is a deep trench having a second depth greater than said first depth completing said forming of said shallow and deep trenches simultaneously in the fabrication of said integrated circuit.

2. The method according to claim 1 wherein said integrated circuit device is a Bipolar device and wherein said semiconductor substrate comprises a barrier layer implanted into a silicon substrate and an overlying epitaxial layer and wherein said deep and shallow trenches form trench isolation regions for said Bipolar device.

3. The method according to claim 1 wherein said integrated circuit device is a memory device and wherein said deep and shallow trenches form capacitors, each having different capacitances depending upon their depths.

4. The method according to claim 1 wherein said pad oxide layer has a thickness of between about 200 and 800 Angstroms.

5. The method according to claim 1 wherein said silicon nitride layer is deposited by low pressure chemical vapor deposition to a thickness of between about 1500 and 2000 Angstroms.

6. The method according to claim 1 wherein said silicon dioxide layer is deposited by low pressure chemical vapor deposition to a thickness of between about 5000 and 10,000 Angstroms.

7. The method according to claim 1 wherein said etching into said substrate through said trench openings comprises etching with chlorine chemistry.

8. A method of forming shallow and deep trenches simultaneously in the fabrication of a Bipolar integrated circuit device comprising:
   implanting a barrier layer into a semiconductor substrate;
   growing a silicon epitaxial layer over said semiconductor substrate;
   providing a pad oxide layer over said epitaxial layer;
   depositing a silicon nitride layer overlying said pad oxide layer;
   depositing a silicon dioxide layer overlying said silicon nitride layer;
   forming a photoresist mask over said silicon dioxide layer wherein said photoresist mask has a first opening having a first width and a second opening having a second width and wherein said second width is larger than said first width;
   etching trench openings through said silicon dioxide, silicon nitride, and pad oxide layers to said underlying semiconductor substrate within said first and second openings;
   removing said photoresist mask;
   thereafter etching into said substrate through said trench openings to form first and second trenches wherein said first trench within said first opening having said first width is a shallow trench having a first depth and wherein said second trench within said second opening having said second width is a deep trench having a second depth greater than said first depth;
   removing said silicon dioxide layer;
   growing a thermal oxide layer within said shallow and said deep trenches;
   depositing a layer of polysilicon overlying said silicon nitride layer and within said trenches;
   etching back said polysilicon layer to leave said polysilicon layer only within said trenches;
   removing said silicon nitride layer where field oxide regions are to be formed;

oxidizing said silicon underlying said pad oxide layer to form field oxide regions overlying said trenches and overlying said epitaxial layer where said silicon nitride layer has been removed;

thereafter removing said silicon nitride layer; and implanting base, emitter, and contact regions into said semiconductor substrate to complete said forming of said shallow and deep trenches simultaneously in the fabrication of said Bipolar integrated circuit device.

9. The method according to claim 8 wherein said pad oxide layer has a thickness of between about 200 and 800 Angstroms.

10. The method according to claim 8 wherein said silicon nitride layer is deposited by low pressure chemical vapor deposition to a thickness of between about 1500 and 2000 Angstroms.

11. The method according to claim 8 wherein said silicon dioxide layer is deposited by low pressure chemical vapor deposition to a thickness of between about 5000 and 10,000 Angstroms.

12. The method according to claim 8 wherein said thermal oxide layer is grown to a thickness of between about 500 and 1500 Angstroms.

13. The method according to claim 8 wherein said polysilicon layer is deposited by low pressure chemical vapor deposition to a thickness of between about 5000 and 7000 Angstroms.

14. A method of forming shallow and deep trenches simultaneously using the microloading effect in the fabrication of an integrated circuit device comprising:

providing a pad oxide layer over a semiconductor substrate;

depositing a silicon nitride layer overlying said pad oxide layer;

depositing a silicon dioxide layer overlying said silicon nitride layer;

forming a photoresist mask over said silicon dioxide layer wherein said photoresist mask has a first opening having a first width and a second opening having a second width and wherein said second width is larger than said first width;

etching trench openings through said silicon dioxide, silicon nitride, and pad oxide layers to said underlying semiconductor substrate within said first and second openings;

removing said photoresist mask; and thereafter etching into said substrate through said trench openings to form first and second trenches wherein because of said microloading effect said first trench within said first opening having said first width is a shallow trench having a first depth and wherein said second trench within said second opening having said second width is a deep trench having a second depth greater than said first depth completing said forming of said shallow and deep trenches simultaneously in the fabrication of said integrated circuit device.

15. The method according to claim 14 wherein said integrated circuit device is a Bipolar device and wherein said semiconductor substrate comprises a barrier layer implanted into a silicon substrate and an overlying epitaxial layer and wherein said deep and shallow trenches form trench isolation regions for said Bipolar device.

16. The method according to claim 15 further comprising:

removing said silicon dioxide layer after said shallow and deep trenches are formed;

growing a thermal oxide layer within said shallow and said deep trenches;

depositing a layer of polysilicon overlying said silicon nitride layer and within said trenches;

etching back said polysilicon layer to leave said polysilicon layer only within said trenches;

removing said silicon nitride layer where field oxide regions are to be formed;

oxidizing said silicon underlying said pad oxide layer to form field oxide regions overlying said trenches and overlying said epitaxial layer where said silicon nitride layer has been removed;

thereafter removing said silicon nitride layer; and implanting base, emitter, and contact regions into said semiconductor substrate to complete said forming of said shallow and deep trenches simultaneously in the fabrication of said Bipolar integrated circuit device.

17. The method according to claim 14 wherein said integrated circuit device is a memory device and wherein said deep and shallow trenches form capacitors, each having different capacitances depending upon their depths.

18. The method according to claim 17 further comprising:

removing said silicon dioxide layer after said shallow and deep trenches are formed;

depositing a capacitor dielectric layer within said shallow and said deep trenches;

depositing a layer of polysilicon overlying said capacitor dielectric layer and within said trenches; and etching back said polysilicon layer to leave said polysilicon layer only within said trenches to complete formation of said capacitors in the fabrication of said integrated circuit memory device.

19. The method according to claim 14 wherein said first width is as small as about 0.5 microns and said first depth is between about 1 to 3 microns.

20. The method according to claim 14 wherein said second width is larger than about 0.8 microns and said second depth is between about 3 to 6 microns.

* * * * *